(12) United States Patent
Choi et al.

(10) Patent No.: US 8,158,538 B2
(45) Date of Patent: Apr. 17, 2012

(54) SINGLE ELECTRON TRANSISTOR OPERATING AT ROOM TEMPERATURE AND MANUFACTURING METHOD FOR SAME

(75) Inventors: Jung Bum Choi, Cheongju-si (KR); Seung Jun Shin, Pyeongchang-gun (KR)

(73) Assignee: Nanochips, Inc., Cheongju-si (KR)

( * ) Notice: Subject to any disclaimer, the term of this patent is extended or adjusted under 35 U.S.C. 154(b) by 115 days.

(21) Appl. No.: 12/874,146

(22) Filed: Sep. 1, 2010

(65) Prior Publication Data

US 2010/0330751 A1 Dec. 30, 2010

Related U.S. Application Data

(63) Continuation-in-part of application No. 12/866,886, filed as application No. PCT/KR2009/000707 on Feb. 13, 2009.

(30) Foreign Application Priority Data

| Feb. 16, 2008 | (KR) | 10-2008-0014230 |
| Aug. 5, 2008 | (KR) | 10-2008-0076550 |
| Feb. 9, 2009 | (KR) | 10-2009-0010087 |

(51) Int. Cl.
*H01L 21/00* (2006.01)
*H01L 21/44* (2006.01)
*H01L 21/84* (2006.01)

(52) U.S. Cl. ........ 438/962; 438/149; 438/652; 977/762; 977/937

(58) Field of Classification Search ............ 438/962, 438/149, 652; 977/762, 937
See application file for complete search history.

(56) References Cited

U.S. PATENT DOCUMENTS

| 7,145,246 B2 * | 12/2006 | Hareland et al. ............. 257/775 |
| 2006/0145136 A1 * | 7/2006 | Verhoeven ...................... 257/14 |
| 2007/0051942 A1 * | 3/2007 | Brown et al. ................... 257/40 |

OTHER PUBLICATIONS

PCT International Search Report, PCT Application No. PCT/KR2009/000707, Aug. 31, 2009, 11 pages.

* cited by examiner

*Primary Examiner* — Luan C Thai
(74) *Attorney, Agent, or Firm* — Fenwick & West LLP

(57) ABSTRACT

The present invention relates to a single-electron transistor (SET) operating at room temperature and a method of manufacturing the same, and to be specific, to a single-electron transistor operating at room temperature and a method of manufacturing the same, which are capable of minimizing influence of the gate voltage on tunneling barriers and effectively controlling the electric potential of a quantum dot (QD), by forming the quantum dot using a trenched nanowire structure and forming the gate to wrap most of the way around the quantum dot.

18 Claims, 14 Drawing Sheets

SINGLE ELECTRON TRANSISTOR OPERATING AT ROOM TEMPERATURE AND MANUFACTURING METHOD FOR SAME

CROSS REFERENCE TO RELATED APPLICATIONS

This application is a continuation-in-part of U.S. patent application Ser. No. 12/866,886, filed on Aug. 9, 2010, and titled "Single Electron Transistor Operating at Room Temperature and Method Manufacturing for Same," which is a National Phase Application under 35 U.S.C. §371 of International Application No. PCT/KR2009/000707 filed on Feb. 13, 2009, which claims priority from Republic of Korea Patent Application No. 10-2008-0014230 filed on Feb. 16, 2008, Republic of Korea Patent Application No. 10-2008-076550 filed on Aug. 5, 2008, and Republic of Korea Patent Application No. 10-2009-0010087 filed on Feb. 9, 2009, which are incorporated by reference herein in their entirety.

BACKGROUND OF THE INVENTION

1. Field of the Invention

The present invention relates to a single-electron transistor (SET) operating at room temperature and a method of manufacturing the same, and to be specific, to a single-electron transistor operating at room temperature and a method of manufacturing the same, which are capable of minimizing influence of the gate voltage on tunneling barriers and effectively controlling the electric potential of a quantum dot (QD), by forming the quantum dot using a trenched nano-wire structure and forming the gate to wrap most of the way around the quantum dot.

2. Background of the Related Art

In semiconductor technology, high-integration, high-speed, and low-power semiconductor devices are being developed in order to store a greater amount of information. The scale-down process of the semiconductor devices resulting from the development of technology inevitably encounters a physical limit. A single-electron transistor using a Coulomb blockade phenomenon, emerged at such a critical point, is expected to replace the complementary metal oxide semiconductor (CMOS) devices. Research has actively been carrying out on the single-electron transistor in order to apply it to the next-generation Tera-level integrated circuit devices.

Recently, with the rapid development of the integrated circuits, computers, portable terminals, etc., having a high degree of an information processing function, are being spread. Such equipments with the high functionality require semiconductor devices with low power consumption, together with a high degree of integration density, because they require high power consumption.

One of the technologies developed in order to comply with these needs is the single-electron transistor. The single-electron transistor is advantageous in that it can greatly reduce power consumption to the microwatt level because it can control the ON/OFF switching current using one electron.

The single-electron transistor, however, has the following problems.

1) The single-electron transistor requires a fine electrode structure in order to efficiently control electrons because it controls one electron using the physical property called Coulomb blockade which is enhanced in a nano-scale quantum dot.

2) The single-electron transistor must include a tunneling barrier between the quantum dot and the source (and also the drain) because it uses a tunneling phenomenon. The tunneling barrier is naturally formed by a pattern-dependant oxidation (PADOX) process when a gate oxide film is formed, making it difficult to intentionally control the height and width of the tunneling barrier. Although intentional tunneling barriers may be formed using a depletion gate, it is difficult to improve the operating temperature of the device because there is a limit in reducing a total capacitance of a quantum dot.

3) The gate is used to control the electric potential of a quantum dot. Here, a conventional single-electron transistor is operated only at low temperature because the tunneling barriers are influenced by the gate.

4) In particular, the gate is formed to cover the source and the drain region as well as the quantum dot. Thus, the gate voltage not only changes the electric potential of the quantum dot, but also influences the tunneling barriers formed on the left and right sides of the quantum dot.

5) When the gate voltage increases as described above, the height of the tunneling barriers is lowered. Consequently, the peak-to-valley current ratio (PVCR) characteristic of Coulomb oscillation is deteriorated.

SUMMARY OF THE INVENTION

Accordingly, the present invention has been made in view of the above problems occurring in the conventional technology, and it is an object of the present invention to provide a single-electron transistor operating at room-temperature and a method of manufacturing the same. To be specific, the object of the present invention is to provide a single-electron transistor (SET) operating at room temperature and a method of manufacturing the same, which are capable of minimizing influence of the gate voltage on tunneling barriers and effectively controlling only the electric potential of a quantum dot (QD), by forming the quantum dot as an active channel using a trenched nano-wire structure and forming the gate to wrap most of the way around the quantum dot For achieving the above object, a method of manufacturing a single-electron transistor operating at room temperature according to the present invention is as follows.

A first method of manufacturing the single-electron transistor using a substrate having a silicon-on-insulator (SOI) structure in which a silicon substrate, a buried oxide layer, and a top silicon layer are stacked includes a first step of forming a nano-wire structure 21a over a substrate; a second step of forming a second insulation film 30 over the substrate so that the nano-wire structure 21a is covered; a third step of forming a trench 31 by etching so that a part of the nano-wire structure 21a is exposed, thereby forming a quantum dot as an active channel between source and drain; a fourth step of forming a third insulation film 40 (i.e., a gate oxide film) as a side-wall spacer on the second insulation film 30 and the trenched area 31; and a fifth step of forming a gate G in the trench 31 so that the quantum dot is surrounded.

The first method further includes, between the fourth step and the fifth step, a sixth step of etching the plane layer of the third insulation film, formed by a deposition process; and a seventh step of forming a source and a drain by implanting impurities using the gate as a mask after etching a part of or all the second insulation film and the third insulation film, or of forming the source and the drain by first forming sidewall spacers S2 and subsequently by implanting impurities using the gate and sidewall spacers S2 as masks.

Furthermore, the nano-wire structure 21a is formed by forming a pattern using a photolithography process or an electron-beam lithography process and then etching a top silicon layer 20. Here, nano-wire structure 21a has a width of 1 to 50 nm and a length of 1 to 1000 nm. Furthermore, in the third step, the trench 31 is formed using a dry etch process or a focus ion beam (FIB) method. A part of the exposed region of the nano-wire 21a is etched in the trench 31.

A second method of manufacturing the single-electron transistor using a substrate having a silicon-on-insulator (SOI) structure in which a silicon substrate, a buried oxide layer, and a top silicon layer are stacked includes a first step of forming a nano-wire structure 21a over a substrate; a second step of forming a second insulation film 30 over the substrate so that the nano-wire structure 21a is covered; a third step of forming a trench 31 by etching so that the nano-wire structure 21a is exposed, thereby forming a quantum dot; a fourth step of forming a metal film by depositing metal material over the substrate; a fifth step of forming a silicide quantum dot by performing an annealing process for the metal film and the quantum dot; a sixth step of removing the metal film not reacting to the quantum dot; a seventh step of depositing a third insulation film on the silicide quantum dot and on a top surface from which the metal film has been removed; and an eighth step of forming a gate by filling the trench with conductive material.

The second method further includes, between the seventh step and the eighth step, a ninth step of etching the plane layer of the third insulation film, formed by a deposition process; and a tenth step of forming a source and a drain by implanting impurities using the gate as a mask after etching a part of or all the second insulation film and the third insulation film or of forming the source and the drain by first forming sidewall spacers and subsequently by implanting impurities using the gate and sidewall spacers as a mask.

A third method of manufacturing the single-electron transistor using a substrate having a silicon-on-insulator (SOI) structure in which a silicon substrate, a buried oxide layer, and a top silicon layer are stacked includes a first step of forming a nano-wire structure 21b on a top silicon layer; a second step of implanting impurities into a top silicon layer using the nano-wire structure as a mask; a third step of forming a second insulation film over a substrate so that the nano-wire structure is covered; a fourth step of forming a trench by etching the top silicon layer and the second insulation film, thereby forming a quantum dot; a fifth step of forming a third insulation film (i.e., a gate oxide film); and a sixth step of forming a gate by filling the trench with conductive material so that the quantum dot is surrounded. The quantum dot is formed by fully etching the nano-wire structure and the second insulation film and then etching a part of a thickness of the top silicon layer, or the quantum dot is formed by etching of a part of the nano-wire structure together with the top silicon layer and the second insulation film.

The third method further includes, between the seventh step and the eighth step, a seventh step of etching the plane layer of the third insulation film, formed by a deposition process; and a, eighth step of forming a source and a drain by implanting impurities using the gate as a mask after etching a part of or all the second insulation film and the third insulation film or of forming the source and the drain by first forming sidewall spacers and subsequently by implanting impurities using the gate and sidewall spacers as a mask. Furthermore, the nano-wire structure 21b is made of insulating material.

In the three methods of manufacturing the single-electron transistor, the buried oxide layer 10, the second insulation film 30, and the third insulation film 40 are an oxide layer or an insulating film. The top silicon layer 20 is made of silicon. The silicon substrate 100 under the buried oxide layer is used as a lower gate. Furthermore, the second insulation film 30 is formed through a deposition process. Furthermore, the third insulation film 40 is formed through a thermal oxidation process, a deposition process, or a deposition process subsequent to a thermal oxidation process. Furthermore, the impurities are phosphorous (P), arsenic (As), or boron (B). Furthermore, the gate G is made of polysilicon including impurities having a concentration of $1\times10^{12}/cm^3$.

Meanwhile, the present invention relates to a single-electron transistor which is manufactured by the above-described methods and operated at room temperature.

BRIEF DESCRIPTION OF THE DRAWINGS

Further objects and advantages of the invention can be more fully understood from the following detailed description taken in conjunction with the accompanying drawings in which.

DETAILED DESCRIPTION OF EMBODIMENTS

Hereinafter, some exemplary embodiments of the present invention are described in detail in connection with specific embodiments with reference to the accompanying drawings.

Figure 1:
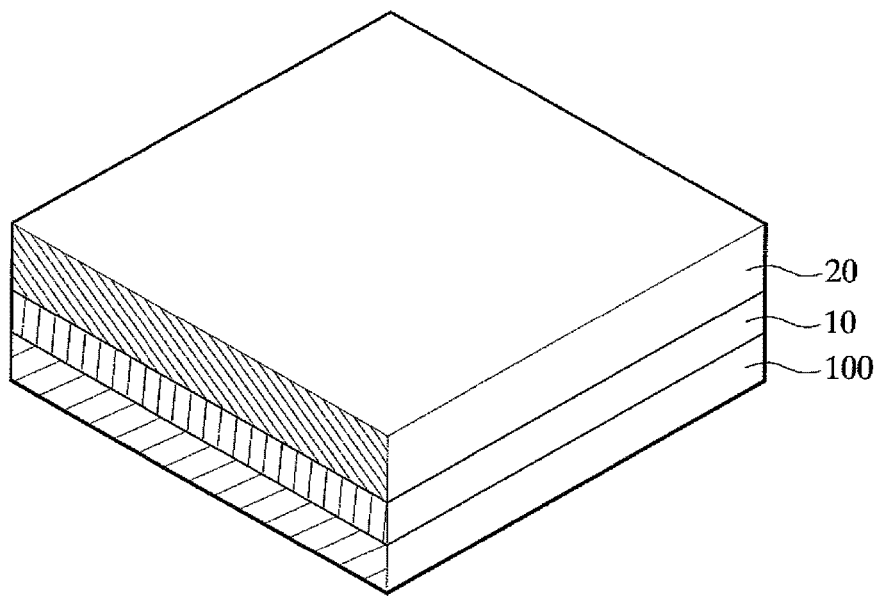
FIG. 1 is a perspective view showing an example of a substrate used in a method of manufacturing a single-electron transistor (SET) according to the present invention.

FIG. 1 is a perspective view showing an example of a substrate used in a method of manufacturing a single-electron transistor according to the present invention. A substrate in which a buried oxide layer 10 and a top silicon layer 20 are repeatedly stacked may be used as the substrate used in an exemplary embodiment of the present invention. However, a SOI substrate having a structure in which a silicon substrate 100, the buried oxide layer 10, and the top silicon layer 20 are sequentially stacked, such as that shown in FIG. 1, is described as an example, for the sake of convenience. Furthermore, although various kinds of conductive materials may be used as the silicon substrate 100 and the top silicon layer 20, it is assumed that the silicon substrate 100 and the top silicon layer 20 are made of silicon. Further, it is assumed that the buried oxide layer 10 is formed of an oxide layer or an insulating film.

First Embodiment of the Present Invention

Figure 2:
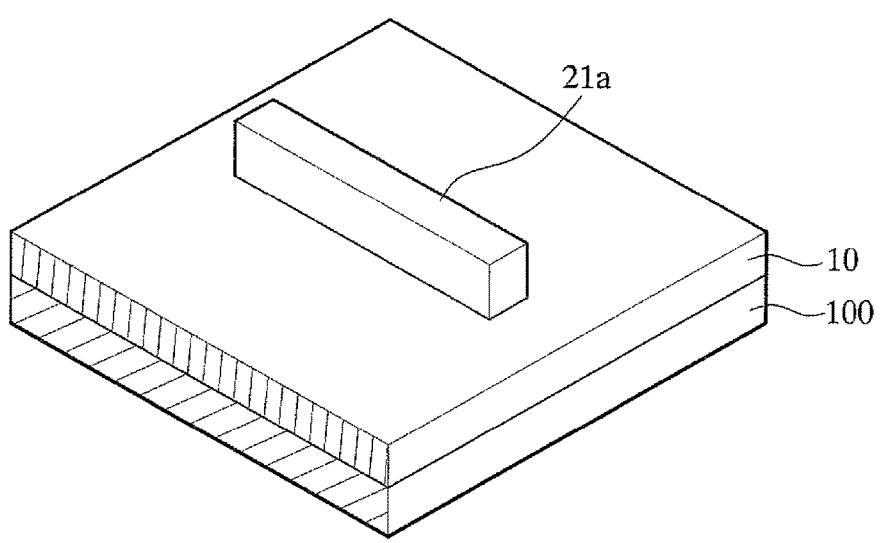
FIG. 2 is a partially sectional perspective view showing a state in which a nano-wire structure is formed according to first and second embodiments of the present invention.

FIG. 2 is a partially sectional perspective view showing a state in which a nano-wire structure 21a according to a first embodiment of the present invention is formed. A first step is a step of forming the nano-wire structure 21a over the SOI substrate. The nano-wire structure 21a is formed by etching the top silicon layer 20. To this end, a resist is coated on the top silicon layer 20, a pattern is formed using a photolithography process or an electron-beam lithography process, and the top silicon layer 20 is etched using the formed pattern as a mask. The formed nano-wire structure can preferably have a width of 1 to 50 nm and a length of 1 to 1000 nm such that the total size of the transistor can be minimized.

Figure 3:
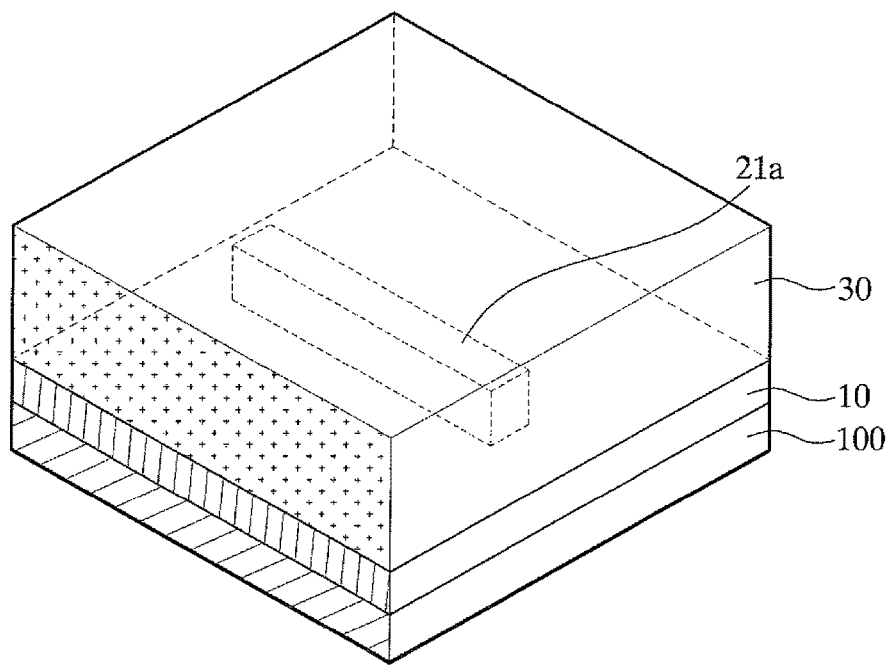
FIG. 3 is a partially sectional perspective view showing a state in which a second insulation film is formed according to the first and second embodiments of the present invention.

FIG. 3 is a partially sectional perspective view showing a state in which a second insulation film 30 is formed according to the first embodiment of the present invention. A second step is a step of forming the second insulation film 30 over the SOI substrate. The second insulation film 30 may be formed at a constant thickness or may have a constant surface on its top as in FIG. 3. The second insulation film 30 plays the role of an insulator for providing electrical insulation. The second insulation film 30 can be made of various insulating materials, such as silicon oxide and silicon nitride. In a preferred embodiment of the present invention, the second insulation film 30 preferably is formed by a deposition process. This is because the second insulation film 30 can be deposited on the entire surface of the substrate at a constant thickness and, particularly, the thickness of the second insulation film 30 can be easily controlled.

Figure 4:
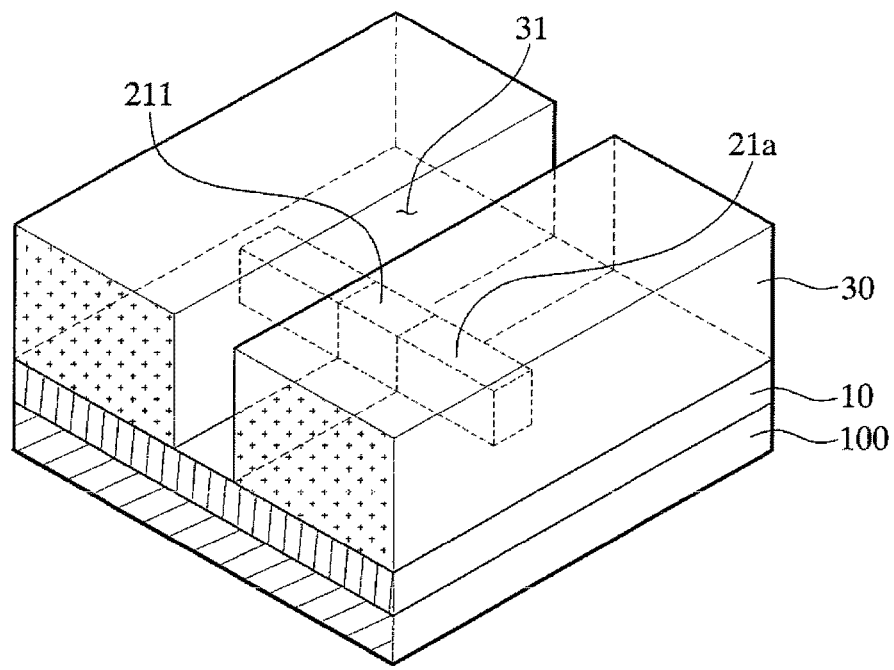
FIG. 4 is a partially sectional perspective view showing an example in which a part of the nano-wire is exposed according to the first embodiment of the present invention.
Figure 5:
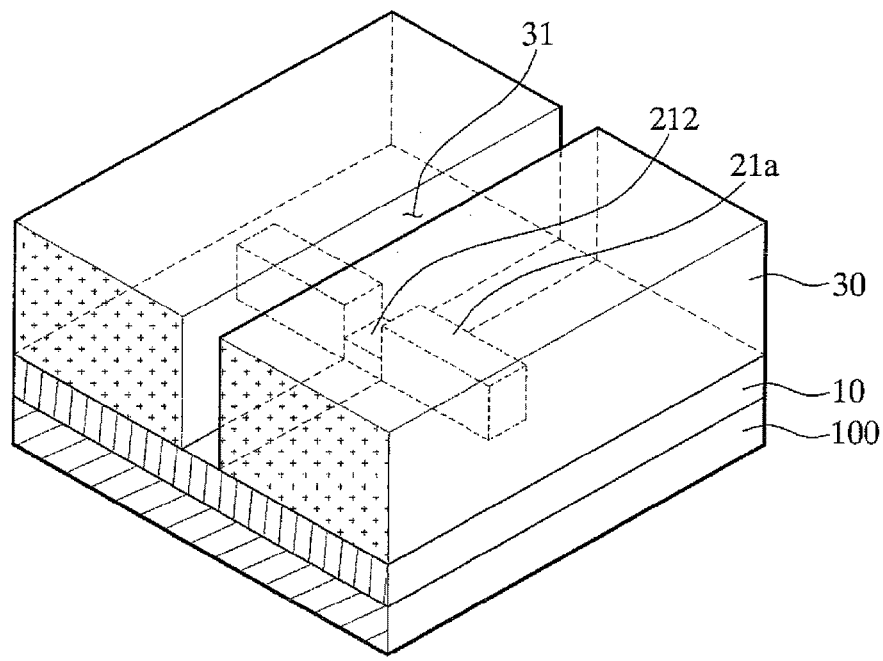
FIG. 5 is a partially sectional perspective view showing another example in which a quantum dot of the trenched part of the exposed nano-wire is formed according to the first and second embodiments of the present invention.

FIG. 4 is a partially sectional perspective view showing an example in which a quantum dot 211 is formed according to the first embodiment of the present invention. FIG. 5 is a partially sectional perspective view showing another example in which a quantum dot 212 is formed according to the first embodiment of the present invention. A third step is a process of forming the quantum dot 211, 212. The second insulation film 30 is etched to expose the nano-wire structure 21a, thereby forming a trench 31. Accordingly, the quantum dot 211, 212 is defined. The trench 31 may be formed in such a manner that a mask pattern is formed normal to the nano-wire structure 21a and then the second insulation film 30 is etched by a dry etch process or the second insulation film 30 is etched using a focus-ion-beam method. Next, the nano-wire structure 21a exposed in the trench 31 is further etched in depth, thereby forming the quantum dot 212. The quantum dot 211 may be formed by etching only the second insulation film 30 so that the nano-wire structure 21a is exposed, as shown in FIG. 4. In an alternative embodiment, the quantum dot 212 may be formed by etching down into the depths of the nano-wire structure 21a in order to make thin the thickness of the quantum dot 212, as shown in FIG. 5. When the trench 31 is formed as described above, the quantum dot 211, 212 formed in the nano-wire structure 21a externally exposed can have 1 to 50 nm in width and 1 to 50 nm in length. Here, the width of the quantum dot corresponds to the width of the nano-wire structure 21a defined in the first step. Furthermore, the width of the trench 31 preferably is 1 to 100 nm so that the quantum dot 211, 212 has a minimum size.

Figure 6:
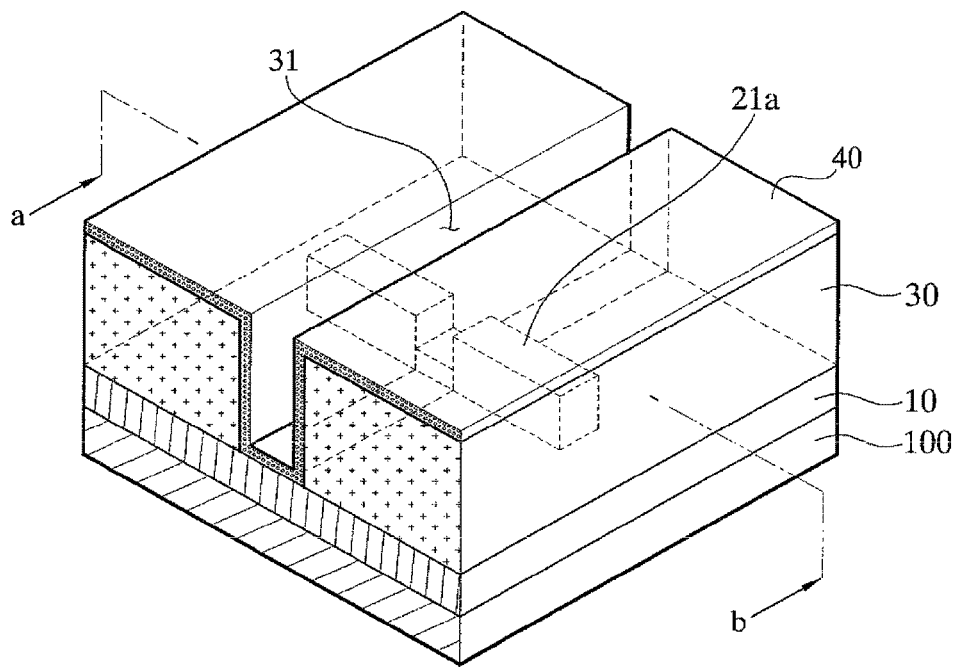
FIG. 6 is a partially sectional perspective view showing a state in which a third insulation film is formed according to the first and second embodiments of the present invention.

FIG. 6 is a partially sectional perspective view showing a state in which a third insulation film 40 is formed according to the first embodiment of the present invention. A fourth step is a step of forming the third insulation film 40 on the top surface of the substrate. The third insulation film 40 is a gate oxide film for insulating the quantum dot and a gate G to be described later from each other. A first gate oxide film 41 is formed to surround the quantum dot by a thermal oxidation process. In this process, the size of the quantum dot is made fine 1 nm to 5 nm, thereby enabling the transistor to operate at room temperature. Next, the third insulation film 40 is deposited at a constant thickness on the entire surface, including the second insulation film 30 and the trench 31, by a deposition process.

Figure 7:
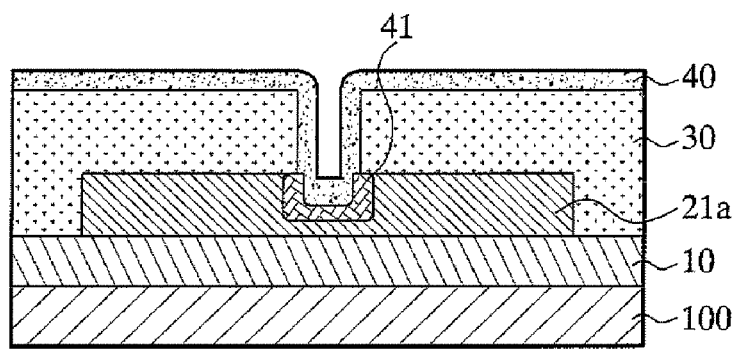
FIG. 7 is a cross-sectional view of the transistor taken along the cutline a-b of FIG. 6 and it shows a structure in which the quantum dot and the third insulation film are formed according to the first and second embodiments of the present invention.

If the third insulation film 40 is formed as described above, the width of the gate G, formed in a subsequent process, can be further narrowed because the width of the trench 31 is further reduced. The third insulation film 40 preferably may be formed by a thermal oxidation process or by a deposition process subsequent to a thermal oxidation process. FIG. 6 shows an example in which, after the quantum dot 212 is formed, the third insulation film 40 is formed by the deposition process subsequent to the thermal oxidation process. FIG. 7 is a cross-sectional view of the transistor taken along the cutline a-b in FIG. 6 and it shows a state in which the quantum dot 212 and the third insulation film 40 is formed according to the first embodiment of the present invention.

Figure 8:
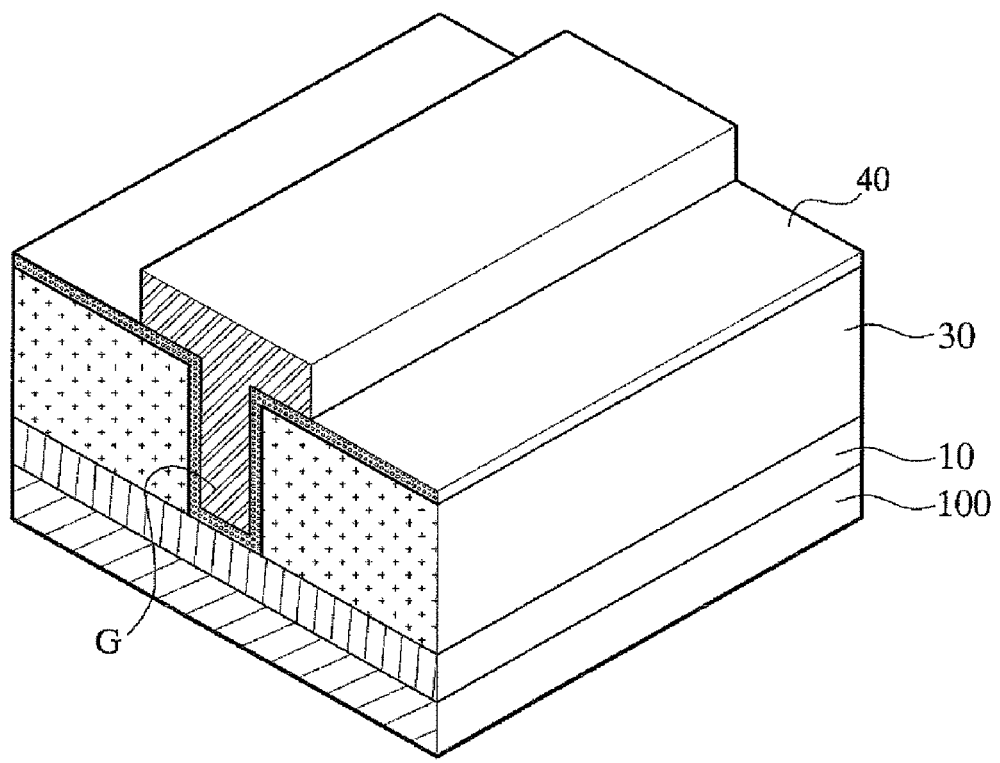
FIG. 8 is a partially sectional perspective view showing an example in which a gate is formed according to the first, second, and third embodiments of the present invention.
Figure 9:
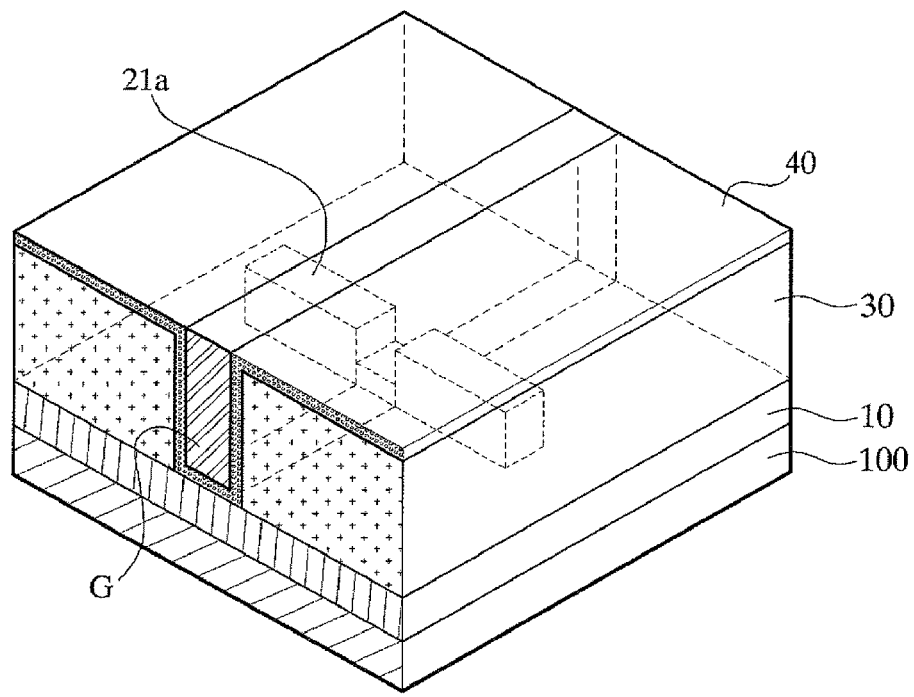
FIG. 9 is a partially sectional perspective view showing another example in which a gate is formed according to the first, second, and third embodiments of the present invention.
Figure 10:
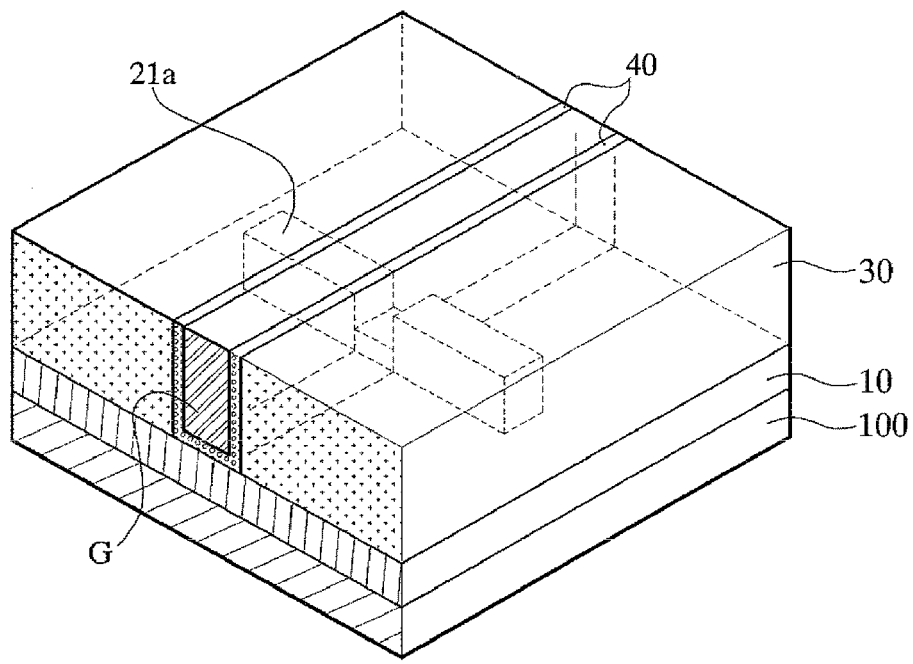
FIG. 10 is a partially sectional perspective view showing yet another example in which a gate is formed according to the first, second, and third embodiments of the present invention.

FIG. 8 is a partially sectional perspective view showing an example in which the gate G is formed according to the first embodiment of the present invention. FIG. 9 is a partially sectional perspective view showing another example in which the gate G is formed according to the first embodiment of the present invention. FIG. 10 is a partially sectional perspective view showing yet another example in which the gate G is formed according to the first embodiment of the present invention. A fifth step is a step of forming the gate G. The gate G is formed in such a way to fill the trench 31 with conductive material. That is, the quantum dot 211, 212 is formed by the fabrication of the trench 31, the quantum dot 211, 212 is surrounded by the third insulation film 40, and the conductive material is filled in the trench, thereby forming the gate G. The gate G preferably may be formed by three kinds of methods. In the first method, as shown in FIG. 8, the trench 31 including the third insulation film 40 is filled with conductive material by a deposition process, thereby forming the gate G. In the second method, the trench 31 including the third insulation film 40 is filled with conductive material by a deposition process, and the gate G is formed only within the trench 31 by an etch process, as shown in FIG. 9. In the third method, the trench 31 including the third insulation film 40 is filled with conductive material by a deposition process, and the gate G is formed only within the trench 31 by a chemical mechanical polishing (CMP) process, as shown in FIG. 10.

Meanwhile, the manufacturing method according to the first embodiment of the present invention may further include a sixth step of etching a part of the third insulation film 40 formed in the fourth step and a seventh step of implanting impurities in order to form the source S and the drain D of the transistor.

Figure 11:
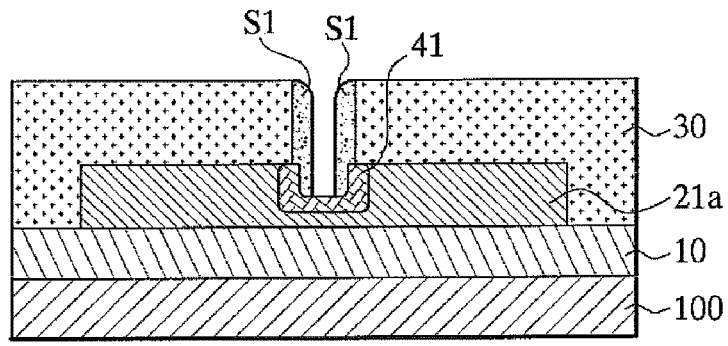
FIG. 11 is a partially sectional perspective view showing a structure in which sidewall spacers S1 are formed by etching the plane layer of the third insulation film formed by a deposition process according to the first, second, and third embodiments of the present invention.

FIG. 11 is a cross-sectional view showing a state in which part of the third insulation film 40 is etched according to the first embodiment of the present invention. The sixth step is a step of etching the third insulation film 40. The third insulation film 40, formed by the deposition process in the fourth step, can be etched so that it remains only on the sidewalls of the trench 31, thereby forming sidewall spacers S1. Here, the gate oxide film includes only the first gate oxide film 41 formed by the thermal oxidation process. FIG. 11 is a cross-sectional view showing a state in which the sidewall spacers S1 are formed by etching a part of the third insulation film 40 according to the first embodiment of the present invention.

Figure 12:
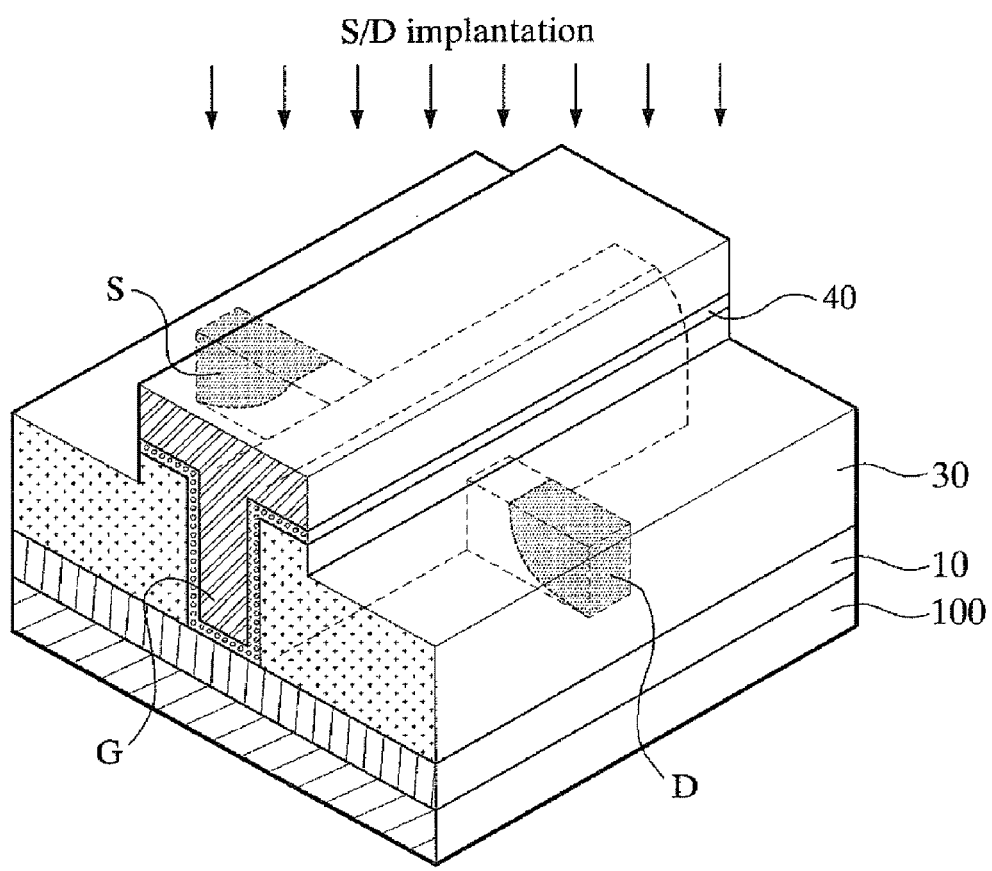
FIG. 12 is a partially sectional perspective view showing an example in which a source and a drain are formed by implanting impurities according to the first, second, and third embodiments of the present invention.
Figure 13:
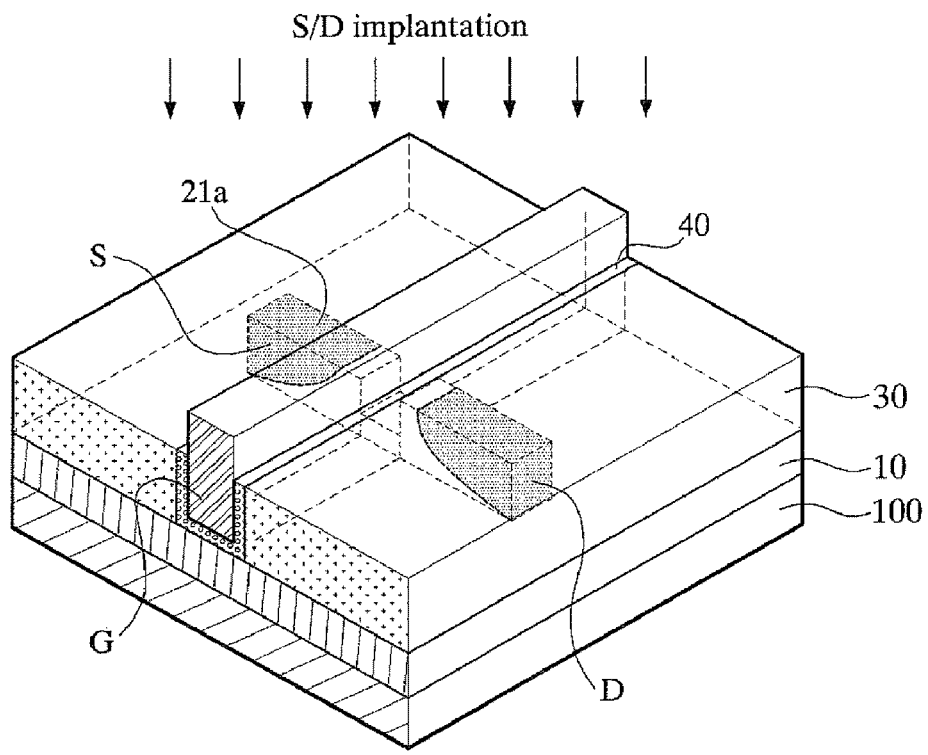
FIG. 13 is a partially sectional perspective view showing another example in which a source and a drain are formed by implanting impurities according to the first, second, and third embodiments of the present invention.
Figure 14:
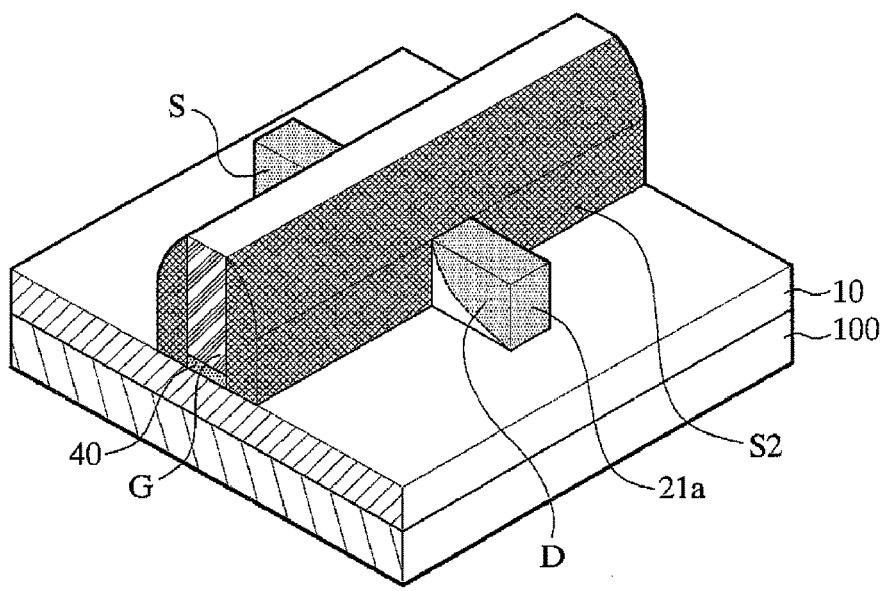
FIG. 14 is a partially sectional perspective view showing yet another example in which a source and a drain are formed by implanting impurities after sidewall spacers S2 are formed according to the first, second, and third embodiments of the present invention.

The seventh step is a step of implanting impurities in order to form the source S and the drain D. Part of or all the second insulation film 30 and the third insulation film 40 are etched to a thickness by a dry etch process so that the impurities can be doped by the ion-implantations using the gate G as a mask. In a preferred embodiment of the present invention, the implantation of the impurities can be performed as follows according to a method of forming the gate G. First, a T-type gate is formed, part of or all the second insulation film 30 and the third insulation film 40 are etched, and then the ion-implantation is performed. Second, the gate is formed only in the trench 31, part of or all the second insulation film 30 and the third insulation film 40 are etched, and then the ion-implantation is performed. Third, the gate is formed only in the trench 31, the second insulation film 30 and the third insulation film 40 are etched, the sidewall spacers S2 are formed, and then the ion-implantation is performed. FIG. 12 is a cross-sectional perspective view showing an example in which the T-type gate is formed, part of the second insulation film 30 and the third insulation film 40 are etched, and the source S and the drain D are then formed by implanting the impurities. FIG. 13 is a cross-sectional perspective view showing another example in which the gate G is formed only in the trench 31, part of the second insulation film 30 and the third insulation film 40 are etched, and then the source S and the drain D are formed by implanting the impurities. FIG. 14 is a cross-sectional perspective view showing yet another example in which the gate G is formed only in the trench 31, the second insulation film 30 and the third insulation film 40 are etched to form sidewall spacers S2, and the source S and the drain D are then formed by implanting the impurities. The method of forming the sidewall spacers is a typical semiconductor process method. In this method, after an insulating film (i.e., a silicon oxide film or a silicon nitride film) is deposited, the sidewall spacers S2 are formed on the sidewalls of the gate G by performing a dry etch process as much as the deposited thickness. The implantation method is performed according to a common implantation method, and a detailed description thereof is omitted.

Figure 15:
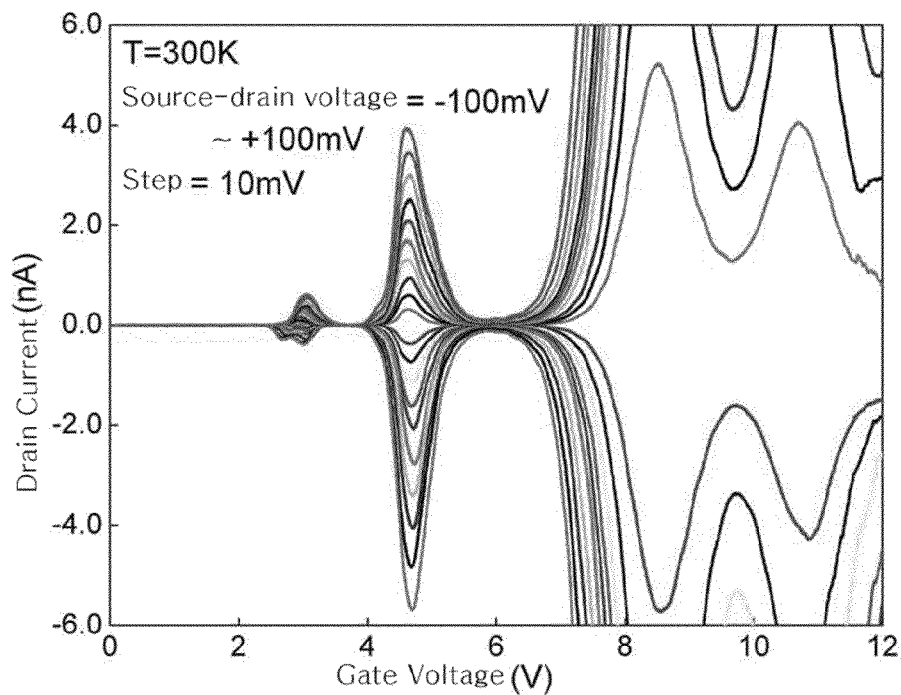
FIG. 15 shows characteristic experimental data of a drain current Id as a function of a gate voltage Vg of the single-electron transistor manufactured according to the first embodiment of the present invention and operated at room temperature 300K.

FIG. 15 shows the experimental data of a drain current Id as a function of a gate voltage Vg at room temperature 300K, which was measured on the single-electron transistor fabricated according to the first embodiment of the present invention. In FIG. 15, the transverse axis indicates the gate voltage Vg, and the vertical axis indicates the drain current Id. The source-drain voltage Vds ranges from −100 mV to +100 mV in which a different color is marked for every step 10 mV. From FIG. 15, it can be clearly seen that the characteristic data of the single-electron transistor, manufactured according to the first embodiment of the present invention, display Coulomb blockade oscillations with high peak-to-valley current ratios (PVCR) at room temperature 300K.

Figure 16:
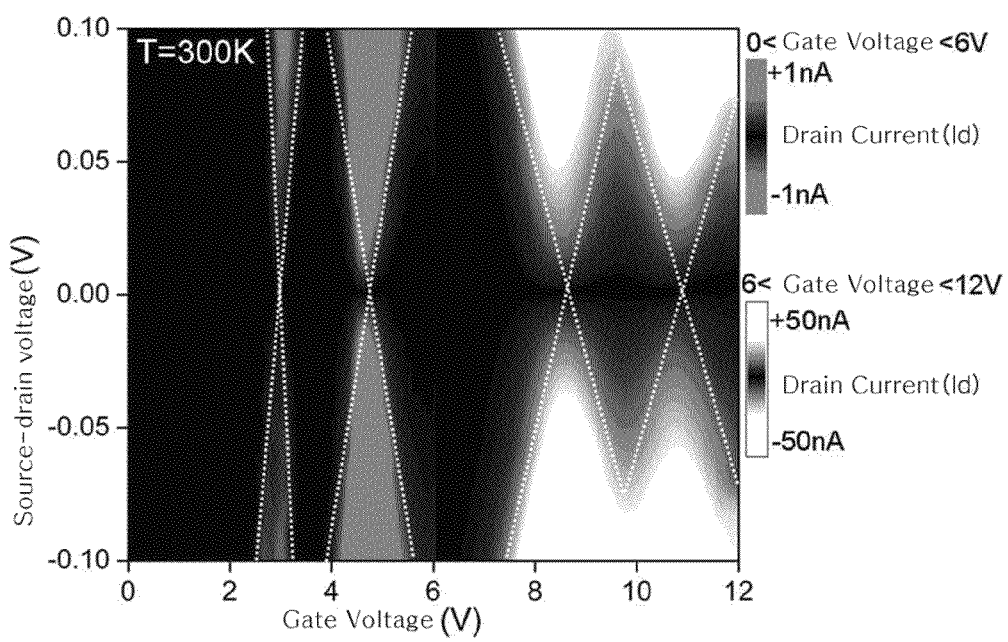
FIG. 16 shows characteristic experimental data of gray-scale contour plot of a drain current Id as a function of a gate voltage Vg and a source-drain bias voltage Vds of the single-electron transistor manufactured according to the first embodiment of the present invention and operated at room temperature 300K.

FIG. 16 shows the experimental data of grayscale contour plot of the drain current Id as a function of gate voltage Vg and the source-drain bias voltage Vds measured on the single-electron transistor manufactured according to the first embodiment of the present invention and operated at room temperature 300K. In FIG. 16, the transverse axis indicates the gate voltage Vg, and the vertical axis indicates the source-drain bias voltage Vds. The gate voltage Vg is indicated in the range of 0 to 6V and the drain current Id is indicated in the range of −1 nA to +1 nA, according to the gray scale. Furthermore, the gate voltage Vg is indicated in the range of 6 to 12 V and the drain current Id is indicated in the range of −50 nA to +50 nA according to the gray scale. From FIG. 16, it can be clearly seen in the gray scale that the single-electron transistor fabricated according to the first embodiment of the present invention shows four clear Coulomb diamonds resulting from the Coulomb blockade at room-temperature 300K.

Second Embodiment of the Present Invention

A first step according to the second embodiment of the present invention is a step of forming a nano-wire structure 21*a*. The first step of forming the nano-wire structure 21*a* preferably is identical with the first step of the first embodiment.

A second step according to the second embodiment of the present invention is a step of forming a second insulation film 30. The second step of forming the second insulation film 30 preferably is identical with the second step of the first embodiment.

A third step according to the second embodiment of the present invention is a step of forming a quantum dot 212. The third step of forming the quantum dot 212 preferably is identical with the third step of the first embodiment.

Figure 17:
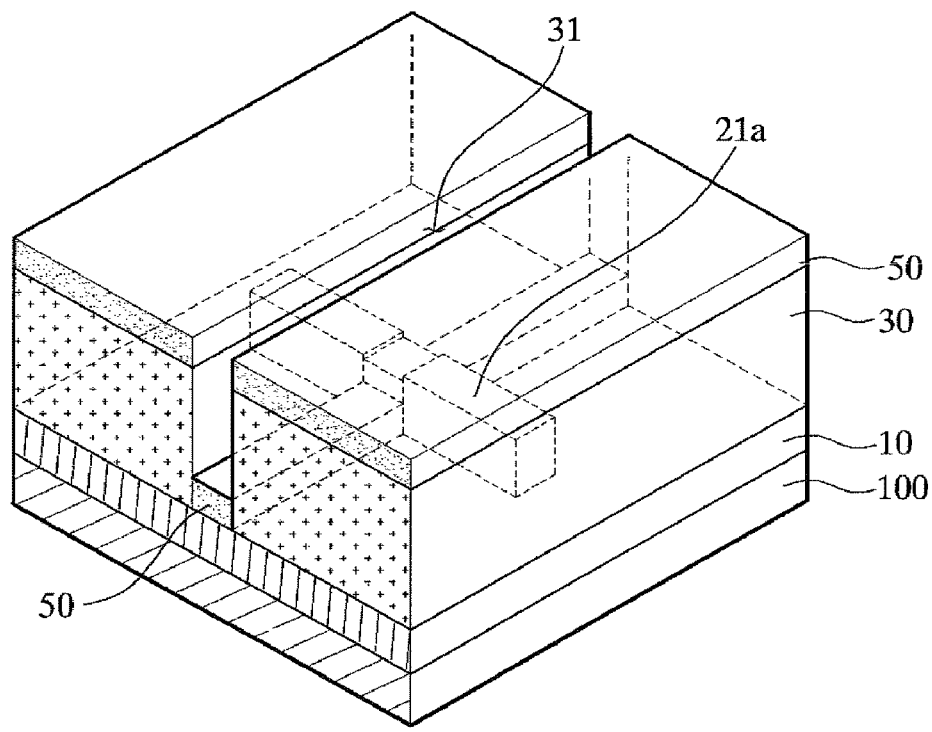
FIG. 17 is a partially sectional perspective view showing a state in which a metal film is deposited according to the second embodiment of the present invention.

FIG. 17 is a partially sectional perspective view showing a state in which a metal film 50 is formed according to the second embodiment of the present invention. As shown in FIG. 17, a fourth step is a step of forming the metal film 50 by depositing metal material on the second insulation film 30, the trench 31, and the quantum dot 212. The metal material of the metal film 50 may include any kind of metal that can react to the quantum dot 212, but preferably includes cobalt (Co). In an alternative embodiment, the metal material of the metal film 50 may include any kind of metal that can react to silicon. The metal film 50 preferably is formed to a thickness of 0.1 to 10 nm using an electron-beam evaporator or a molecular beam epitaxy (MBE) equipment.

Figure 18:
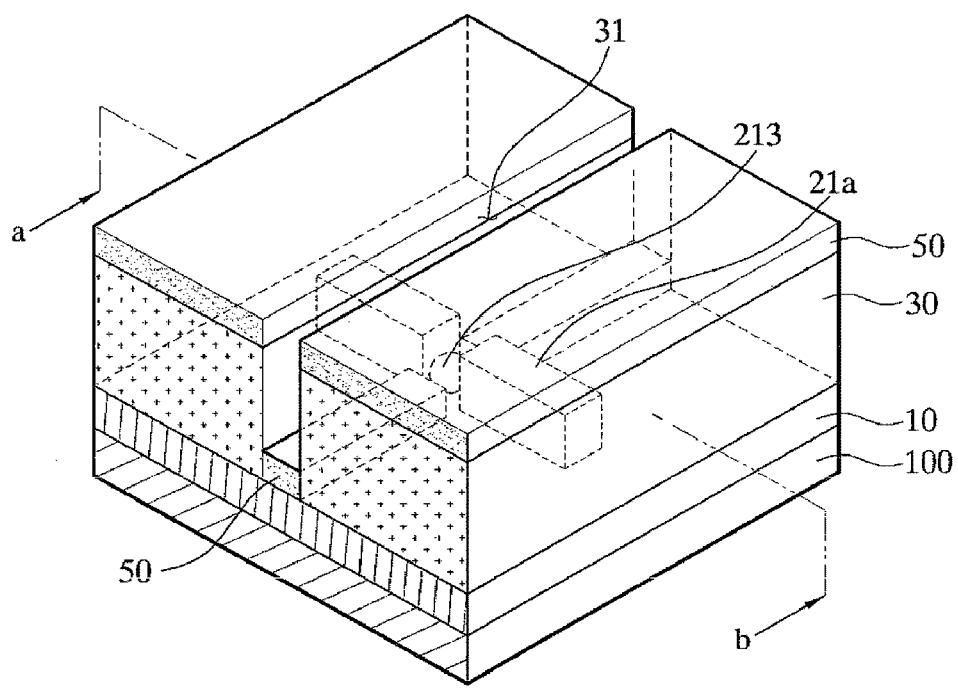
FIG. 18 is a partially sectional perspective view showing a state in which a silicide quantum dot is formed according to the second embodiment of the present invention.
Figure 19:
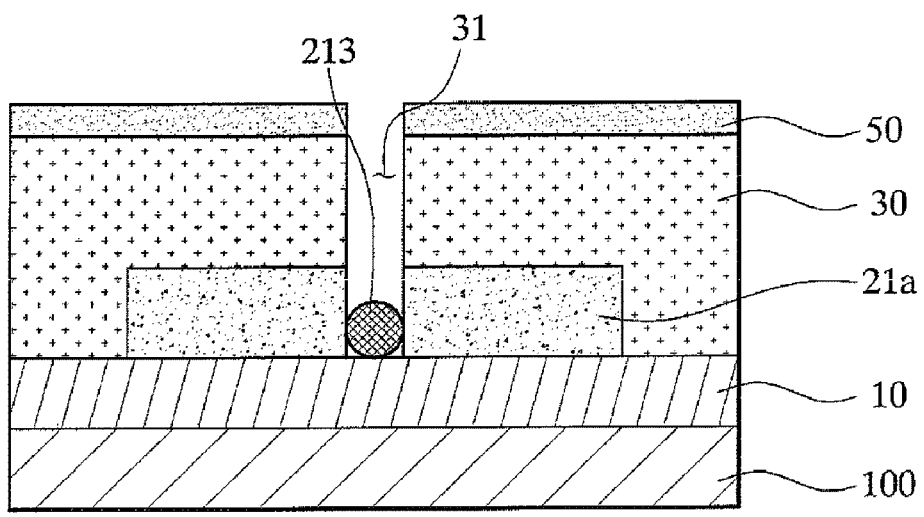
FIG. 19 is a cross-sectional view of the transistor taken along the cutline a-b in FIG. 18 and it shows an example in which a silicide quantum dot is formed according to the second embodiment of the present invention.
Figure 20:
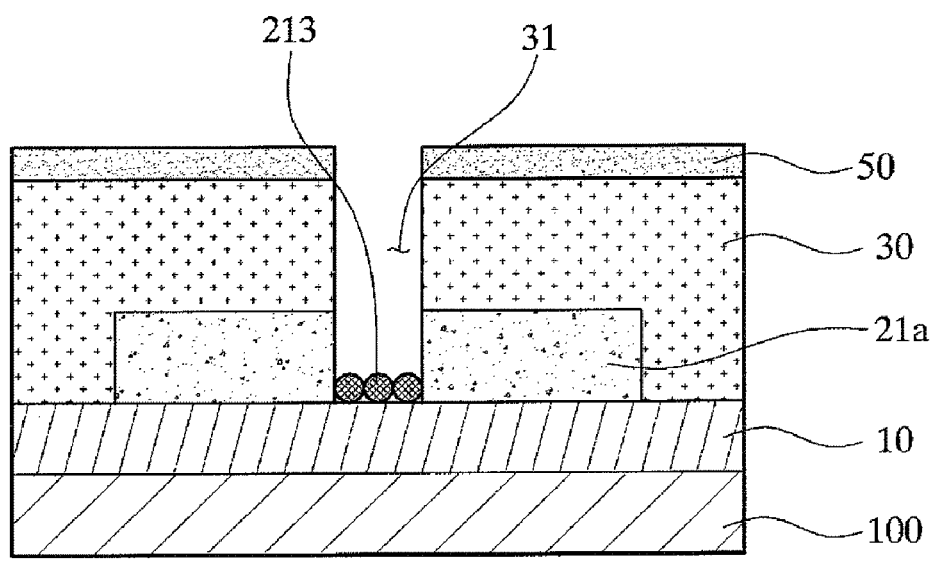
FIG. 20 is a cross-sectional view showing another example in which silicide multiple quantum dots (QDs) are formed according to the second embodiment of the present invention.

FIG. 18 is a partially sectional perspective view showing a state in which a silicide quantum dot 213 is formed according to the second embodiment of the present invention. FIG. 19 is a cross-sectional view of the transistor taken along the cutline a-b in FIG. 18 and it shows an example in which the silicide quantum dot 213 is formed according to the second embodiment of the present invention. As shown in FIGS. 18 and 19, a fifth step is a step of forming the silicide quantum dot 213 by the reaction of the metal film 50 and the quantum dot 212 by an annealing process. The quantum dot 212 is silicided into the silicide quantum dot 213 by the annealing process using electron-beam lithography, RTA, a furnace, or an annealing apparatus. The silicide quantum dot 213 is formed only at the portion where the metal film 50 and the quantum dot 212 come in contact with each other. Here, the metal film 50 formed on the second insulation film 30 and the metal film 50 formed on the buried oxide layer 10 do not react to each other, and so the metal films 50 are not silicided. The silicide quantum dot 213 has a diameter of 0.1 to 10 nm, and one to fifty silicide quantum dots 213 preferably are formed in series or in parallel. A primary cause of forming the silicide quantum dot 213 is determined by the width of the nano-wire structure 21*a* and the width of the trench 31. In other words, with an increase in the width of the trench 31, a number of the silicide quantum dots 213 are formed in series, and with an increase in the width of the nano-wire structure 21*a*, a number of the silicide quantum dots 213 are formed in parallel. FIG. 20 is a cross-sectional view showing another example in which the silicide quantum dots 213 are formed according to the second embodiment of the present invention. As shown in FIG. 20, a number of the silicide quantum dots 213 are formed. The number of silicide quantum dots 213 can be controlled by controlling the width of the trench 31.

Figure 21:
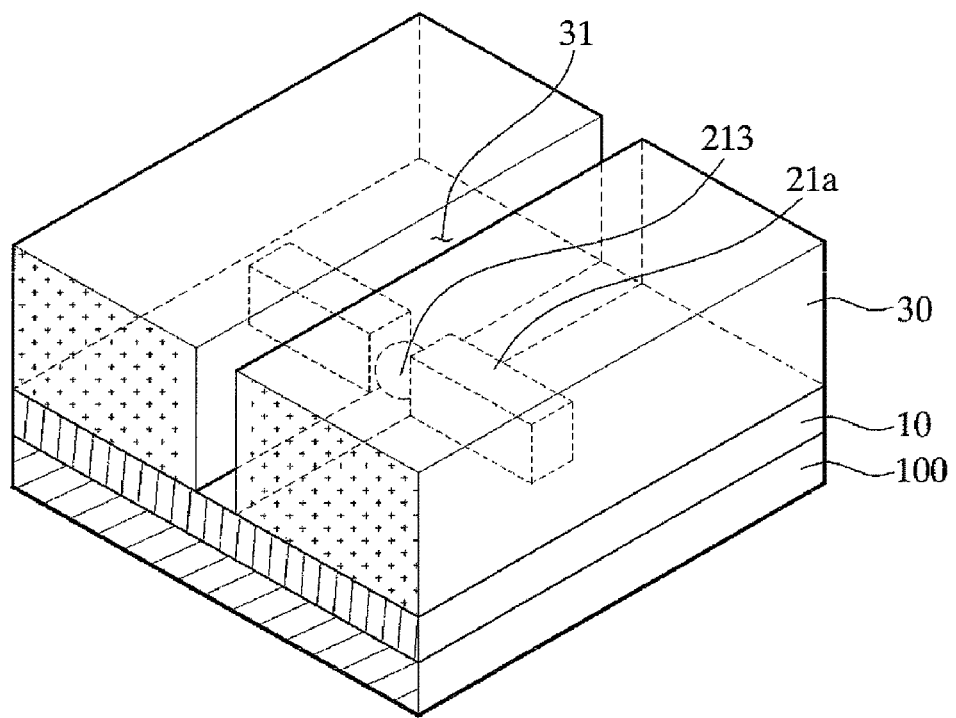
FIG. 21 is a partially cross-sectional perspective view showing a state in which the metal film has been removed according to the second embodiment of the present invention.

FIG. 21 is a partially cross-sectional perspective view showing a state in which the metal film 50 has been removed according to the second embodiment of the present invention. As shown in FIG. 21, a sixth step is a step of removing the metal film 50 that has not reacted to the quantum dot 212. The metal film 50 that has not formed into the silicide quantum dot 213 by the reaction of the metal film 50 and the quantum dot 212 is removed. The non-silicided metal film 50 preferably is removed using a mixed solution of sulfuric acid and hydrogen peroxide. In an alternative embodiment, the non-silicided metal film 50 may be removed by partially or fully removing the second insulation film 30 by etching.

A seventh step according to the second embodiment of the present invention is a step of forming a third insulation film 40 for insulating the silicide quantum dot 213 and a gate to be described later from each other (refer to FIG. 6). The seventh step of forming the third insulation film 40 preferably is identical with the fourth step of the first embodiment. Furthermore, the third insulation film 40 preferably is formed using an oxide film by a deposition process, a thermal oxidation process, or a deposition process subsequent to a thermal oxidation process.

An eighth step according to the second embodiment of the present invention is a step of forming the gate G by filling the trench 31 with conductive material. The eighth step of forming the gate G preferably is identical with the fifth step of the first embodiment.

Meanwhile, the manufacturing method according to the second embodiment of the present invention may further include a ninth step of etching a part of the third insulation film 40 formed in the seventh step and a tenth step of forming the source and the drain of the transistor by implanting impurities. The ninth step of etching a part of the third insulation film 40 according to the second embodiment of the present invention preferably is identical with the sixth step of the first embodiment. The tenth step of forming the source and the drain of the transistor by implanting the impurities according to the second embodiment of the present invention preferably is identical with the seventh step of the first embodiment.

Third Embodiment of the Present Invention

Figure 22:
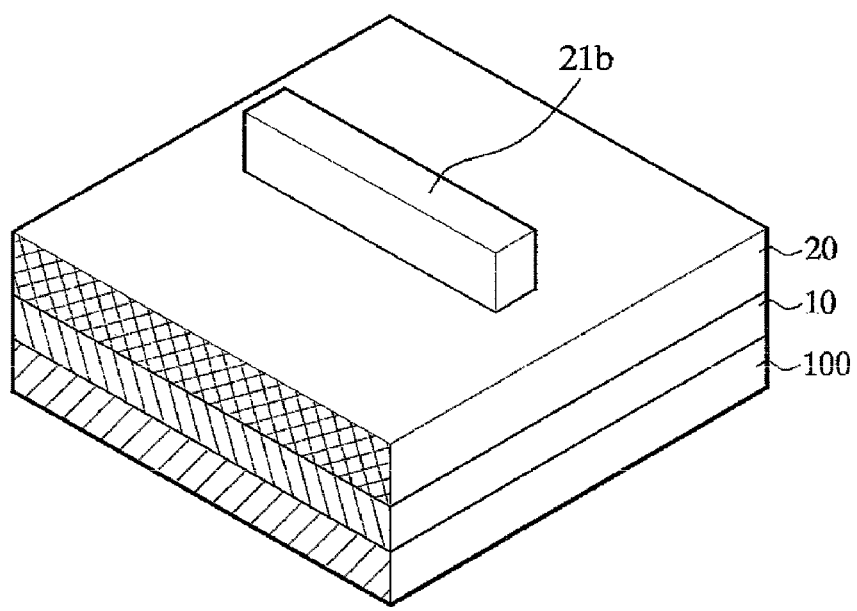
FIG. 22 is a partially sectional perspective view showing a state in which a nano-wire structure is formed according to the third embodiment of the present invention.

FIG. 22 is a cross-sectional perspective view showing a state in which a nano-wire structure 21*b* is formed according to a third embodiment of the present invention. A first step is a step of forming the nano-wire structure 21*b*. The nano-wire structure 21*b* is formed on a top silicon layer 20. In particular, the nano-wire structure 21*b* is formed by coating a resist on the top silicon layer 20, forming a pattern using a photolithography process or an electron-beam lithography process, and then etching the remaining portions other than the formed pattern. In a typical method, the nano-wire structure 21*b* is formed by depositing insulating material, forming a pattern using a lithography process, and then performing etching. In particular, the insulating material can include silicon oxide or silicon nitride. The nano-wire structure 21*b* is made of the insulating material.

Figure 23:
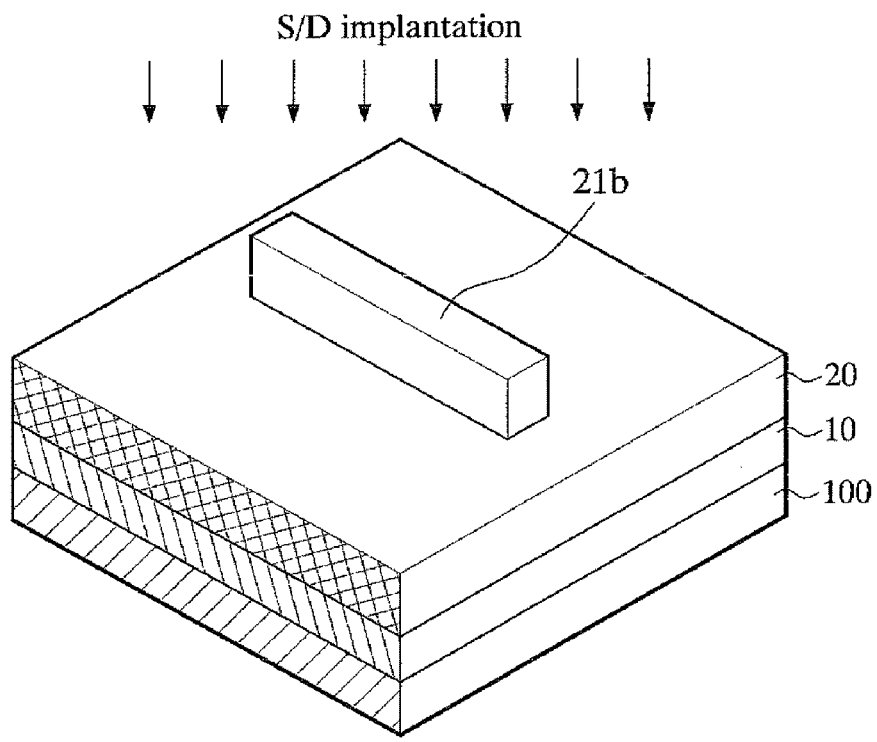
FIG. 23 is a partially sectional perspective view showing an example in which impurities are doped using the nano-wire structure as a mask according to the third embodiment of the present invention.

FIG. 23 is a cross-sectional perspective view showing an example in which impurities are doped in order to form a source S and a drain D according to the third embodiment of the present invention. A second step is a step of implanting the impurities into the top silicon layer 20. The implantation of the impurities is performed in the state in which the nano-wire structure 21*b* is formed. The implantation is performed in order to form the source S and the drain D of the single-electron transistor. In a preferred embodiment of the present invention, the implantation of the impurities preferably is performed using the nano-wire structure 21*b* as a mask. The source S, the drain D, and a quantum dot 214, 215 are formed in the top silicon layer 20 corresponding to the bottom of the nano-wire structure 21*b* through subsequent processes to be described later. The impurities are diffused into regions other than the region in which the quantum dot is formed due to a difference in the concentration, thereby forming the source S and the drain D.

Figure 24:
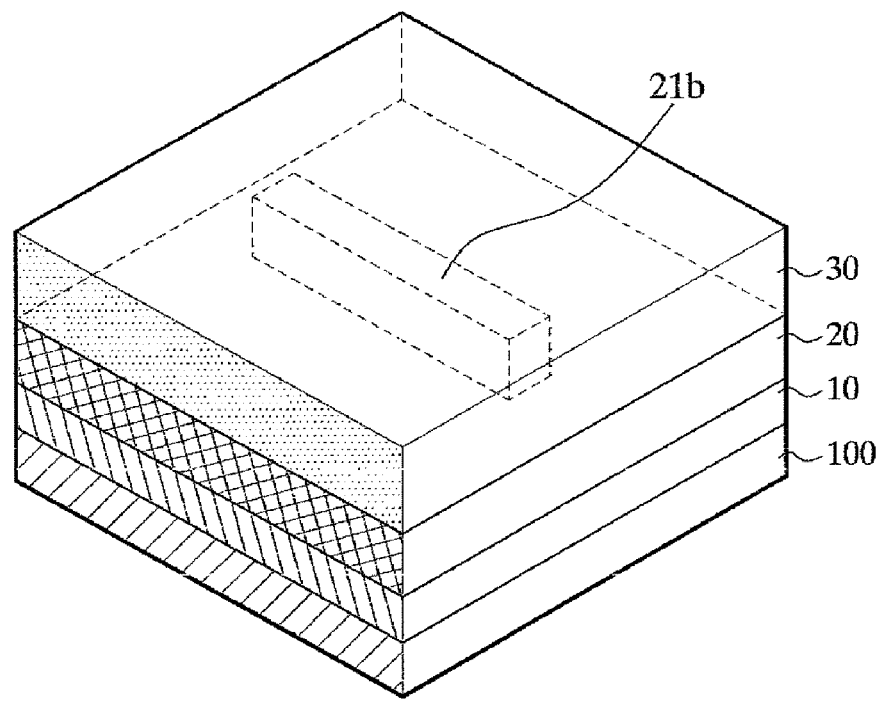
FIG. 24 is a partially sectional perspective view showing a state in which the second insulation film is formed according to the third embodiment of the present invention.

FIG. 24 is a cross-sectional perspective view showing a state in which a second insulation film 30 is formed according to the third embodiment of the present invention. A third step is a step of forming the second insulation film 30. The method of forming the second insulation film 30 according to the third embodiment of the present invention preferably is identical with the second step of the first embodiment.

Figure 25:
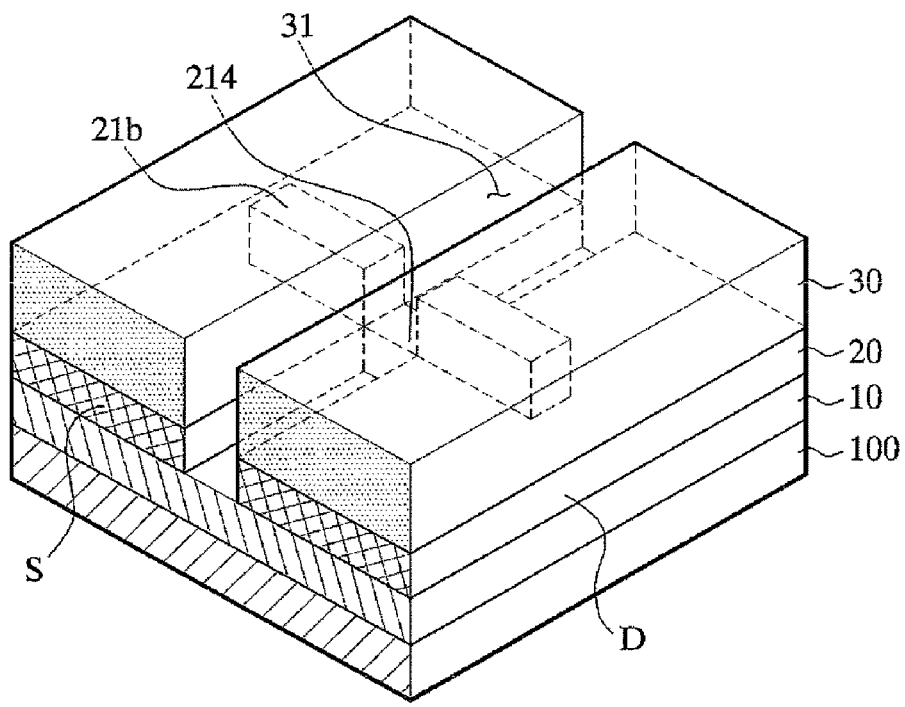
FIG. 25 is a cross-sectional perspective view showing an example in which a trench and a quantum dot are formed according to the third embodiment of the present invention.
Figure 26:
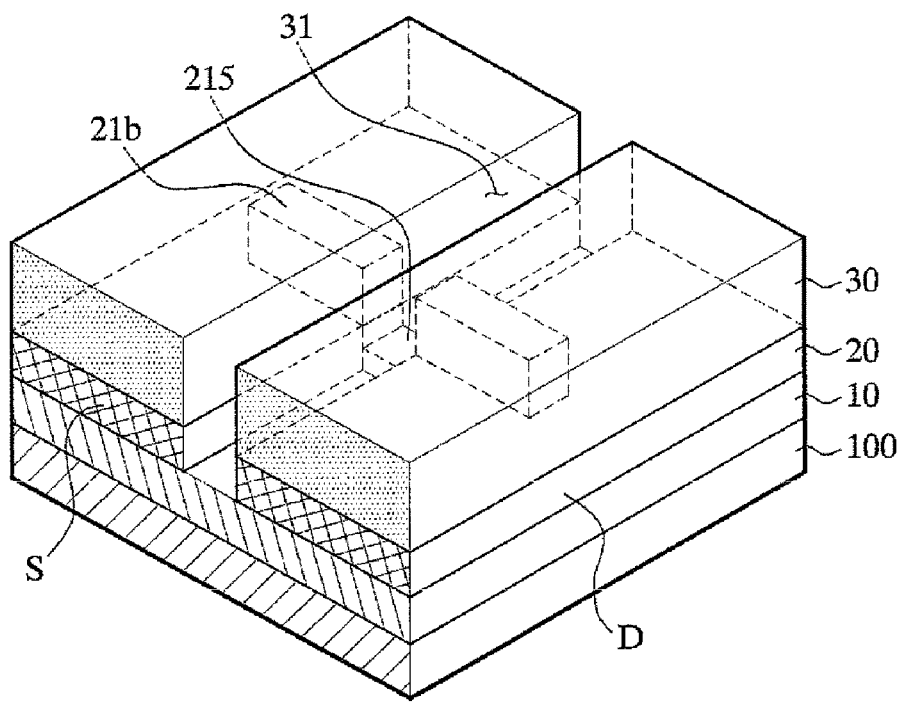
FIG. 26 is a cross-sectional perspective view showing another example in which a trench and a quantum dot are formed according to the third embodiment of the present invention.
Figure 27:
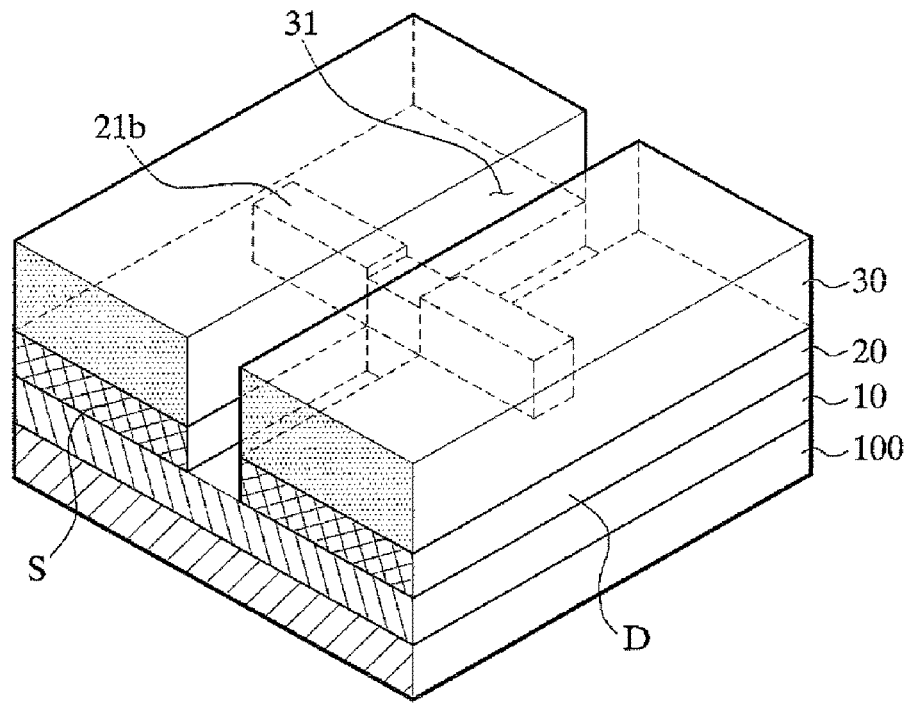
FIG. 27 is a cross-sectional perspective view showing yet another example in which a trench and a quantum dot are formed according to the third embodiment of the present invention.

FIG. 25 is a cross-sectional perspective view showing an example in which a quantum dot is formed according to the third embodiment of the present invention. A fourth step is a step of forming the quantum dot 214, 215. The quantum dot 214, 215 is formed by forming a mask pattern so that the mask pattern is perpendicular to the nano-wire structure 21b and then etching the second insulation film 30, the nano-wire structure 21b, and the top silicon layer 20. Here, the etching can be performed using a dry etch process or a focused-ion beam (FIB) method. In particular, FIG. 25 shows an example in which the quantum dot 214 is defined by etching the top silicon layer 20, the second insulation film 30, and the nano-wire structure 21b except for the top silicon layer 20 at the bottom of the nano-wire structure 21b. FIG. 26 is a cross-sectional perspective view showing another example in which the quantum dot 215 is formed according to the third embodiment of the present invention. The thickness of the quantum dot 215 can have 1 to 50 nm by etching the top silicon layer 20. FIG. 27 is a cross-sectional perspective view showing yet another example in which a quantum dot 214 is formed according to the third embodiment of the present invention. In FIG. 27, the quantum dot 214 is defined by etching a part of the thickness of the nano-wire structure 21b.

A fifth step according to the third embodiment of the present invention is a step of forming a third insulation film 40. The third insulation film 40 is a gate oxide film for insulating the quantum dot and gates G to be described later from each other. The portion through which the top silicon layer 20 is exposed by the formation of the trench 31 is made (to have a constant thickness) by forming a first gate oxide film 41 by a thermal oxidation process and then performing a deposition process. The fifth step of forming the third insulation film 40 according to the third embodiment of the present invention preferably is identical with the fourth step of the first embodiment.

Figure 28:
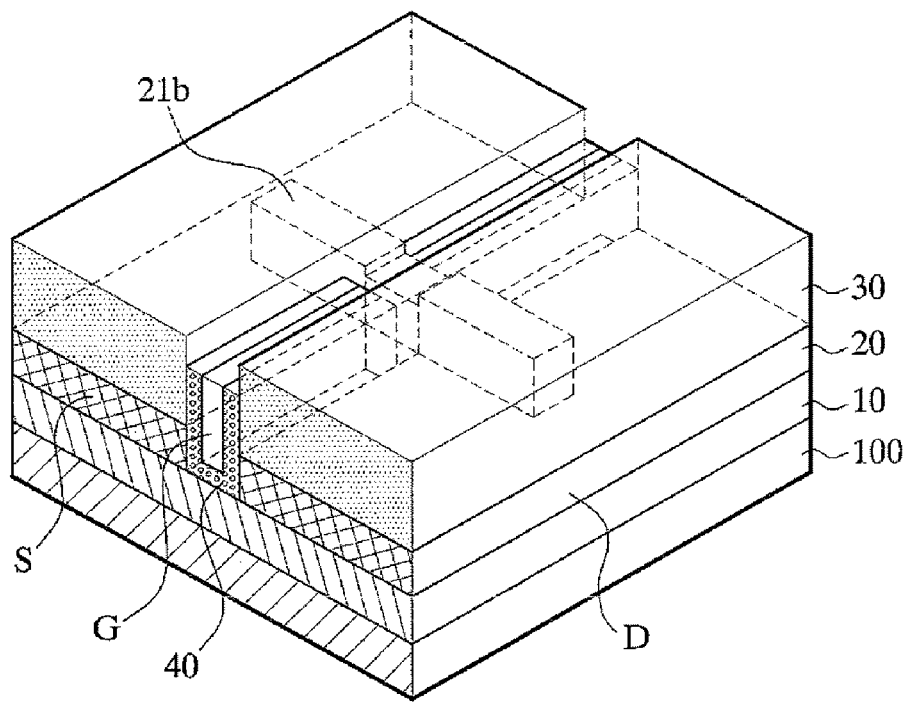
FIG. 28 is a cross-sectional perspective view showing a state in which gates are formed according to the third embodiment of the present invention.

A sixth step according to the third embodiment of the present invention is a step of forming the gates G. The gates G are formed by filling the trench 31 with conductive material, after the quantum dot and the gate oxide film are formed. The sixth step according to the third embodiment of the present invention preferably is identical with the fifth step of the first embodiment. FIG. 28 is a cross-sectional perspective view showing a state in which the gates G are formed according to the third embodiment of the present invention. Referring to FIG. 28, after the quantum dot 214 and the third insulation film 40 are formed, the conductive material is filled into the front surface of the substrate by a deposition process. Next, the conductive material is etched to expose the nano-wire structure 21b over the quantum dot 214 by an etch process or a CMP process, thereby forming two symmetrical gates on the basis of the nano-wire structure 21b.

Polysilicon, including impurities having a concentration of $1 \times 10^{12}/cm^3$ or more, can be used as the conductive material according to the first, second, and third embodiments of the present invention. The impurities can include, for example, phosphorous (P), arsenic (As), and boron (B), and can be used for Ion-implantation.

Meanwhile, the present invention includes single-electron transistors manufacturing the above-described manufacturing methods.

As described above, the present invention has the following advantages.

1) Total capacitance of the quantum dot formed by a trenched nano-wire structure can be reduced. Accordingly, the operating temperature of the single-electron transistor can be raised, and the single-electron transistor can be operated at room temperature.

2) Influence on a tunneling barrier can be minimized because the gate is formed to wrap most of the way around the quantum dot. Accordingly, the peak-to-valley current ratio (PVCR) of the Coulomb oscillations can be increased at room-temperature.

3) Process costs can be reduced and the manufacturing process can be simplified because existing CMOS manufacturing processes can be used without change.

4) Total capacitance of the quantum dot, formed by second embodiment Of the present invention, can be reduced because one or more metal dot-based silicide quantum dots are formed in series, and the operating temperature can be improved The present invention can be applied to single-electron transistors operating at room temperature and a method of manufacturing the same, which are capable of minimizing influence on a tunneling barrier by a gate, effectively controlling the electric potential of a quantum dot, and improving the efficiency of an operation.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of manufacturing a single-electron transistor (SET) operating at room temperature using a silicon-on-insulator (SOI) substrate in which at least one buried oxide layer 10 and a top silicon layer 20 are stacked, the method comprising:
    a first step of forming a nano-wire structure 21a by etching the top silicon layer 20;
    a second step of forming a second insulation film 30 over an entire surface of the SOI substrate;
    a third step of forming a trench 31 and a quantum dot 211, 212 by etching the second insulation film 30;
    a fourth step of forming a third insulation film 40 over an entire surface of the SOI substrate; and
    a fifth step of forming a gate G in the trench 31 so that the gate wraps around the quantum dot 211, 212.

2. The method as claimed in claim 1, further comprising, between the fourth step and the fifth step:
    a sixth step of forming sidewall spacers S1 by etching a part of the third insulation film 40 formed by a deposition process; and
    a seventh step of etching a part of the second insulation film 30 and part of the third insulation film 40 and implanting impurities using the gate G as a mask, thereby forming a source and a drain.

3. The method as claimed in claim 1, wherein:
    the second insulation film 30 is formed to a thickness of 10 nm to 1000 nm by a deposition process, and the third insulation film 40 is formed by a thermal oxidation process or by a deposition process subsequent to a thermal oxidation process.

4. The method as claimed in claim 1, wherein in the first step, the nano-wire structure 21*a* formed by etching the top silicon layer 20 has a width of 1 to 50 nm and a length of 10 to 1000 nm.

5. The method as claimed in claim 1, wherein in the third step, the trench 31 is formed to have a width of 1 to 100 nm by etching, and the quantum dot 212 is formed to have a thickness of 1 to 50 nm by etching a part of a thickness of the top silicon layer 20.

6. The method as claimed in claim 2, wherein the seventh step comprises the step of forming sidewall spacers S2 in the gate G and implanting impurities using the gate G and the sidewall spacers S2 as a mask, thereby forming the source and the drain.

7. A method of manufacturing a single-electron transistor operating at room temperature using an SOI substrate in which at least one buried oxide layer 10 and a top silicon layer 20 are stacked, the method comprising:
  a first step of forming a nano-wire structure 21*a* by etching the top silicon layer 20;
  a second step of forming a second insulation film 30 over an entire surface of the SOI substrate;
  a third step of forming a trench 31 and a quantum dot 212 by etching the second insulation film 30;
  a fourth step of forming a metal film 50 by depositing metal material on an entire surface of the SOI substrate;
  a fifth step of forming a silicide-based quantum dot 213 by annealing the SOI substrate;
  a sixth step of removing the metal film 50 that has not reacted to the quantum dot 212;
  a seventh step of forming a third insulation film 40 on an entire surface of the SOI substrate; and
  an eighth step of forming a gate G by filling the trench 31 with conductive material so that the gate wraps around the quantum dot 213.

8. The method as claimed in claim 7, further comprising, between the seventh step and the eighth step:
  a ninth step of forming sidewall spacers S1 by etching a part of the third insulation film 40 formed through a deposition process; and
  a tenth step of etching a part of the second insulation film 30 and part of the third insulation film 40 and implanting impurities using the gate G as a mask, thereby forming a source and a drain.

9. The method as claimed in claim 7, wherein in the seventh step, the third insulation film 40 is formed by deposition after fully or partially removing the second insulation film 20.

10. The method as claimed in claim 7, wherein:
  the second insulation film 30 is formed to a thickness of 10 nm to 1000 nm by a deposition process, and
  the third insulation film 40 is formed by a thermal oxidation process or by a deposition process subsequent to a thermal oxidation process.

11. The method as claimed in claim 8, wherein the tenth step comprises the step of forming sidewall spacers S2 in the gate G and implanting impurities using the gate G and the sidewall spacers S2 as a mask, thereby forming the source and the drain.

12. A method of manufacturing a single-electron transistor operating at room temperature using an SOI substrate in which at least one buried oxide layer 10 and a top silicon layer 20 are stacked, the method comprising:
  a first step of forming a nano-wire structure 21*b* on the top silicon layer 20;
  a second step of doping the top silicon layer 20 with impurities using the nano-wire structure 21*b* as a mask;
  a third step of forming a second insulation film 30 over an entire surface of the SOI substrate;
  a fourth step of forming a trench 31 and a quantum dot 214, 215 by etching the second insulation film 30;
  a fifth step of forming a third insulation film 40 to surround the quantum dot; and
  a sixth step of forming a gate G in the trench so that the gate wraps around the quantum dot.

13. The method as claimed in claim 12, wherein the quantum dot 214, 215 is formed by fully etching the nano-wire structure 21*b* and the second insulation film 30 and then etching a part of a thickness of the top silicon layer 20 or etching a part of the nano-wire structure 21*b* together with the top silicon layer 20 and the second insulation film 30.

14. The method as claimed in claim 12, wherein the nano-wire structure 21*b* is made of insulating material.

15. The method as claimed in claim 12, wherein:
  the second insulation film 30 is formed to a thickness of 10 nm to 1000 nm by a deposition process, and
  the third insulation film 40 is formed by a thermal oxidation process or by a deposition process subsequent to a thermal oxidation process.

16. The method as claimed in claim 1, wherein in the fifth step, the gate G is formed by an etch process, an etch-back process, or a chemical mechanical polishing (CMP) process, and the gate G is formed in the trench 31 or over the trench 31 and the second insulation film 30.

17. The method as claimed in claim 7, wherein in the eighth step, the gate G is formed by an etch process, an etch-back process, or a chemical mechanical polishing (CMP) process, and the gate G is formed in the trench 31 or over the trench 31 and the second insulation film 30.

18. The method as claimed in claim 12, wherein in the sixth step, the gate G is formed by an etch process, an etch-back process, or a chemical mechanical polishing (CMP) process, and the gate G is formed in the trench 31 or over the trench 31 and the second insulation film 30.

* * * * *